(12) United States Patent
Baek et al.

(10) Patent No.: US 11,626,870 B1
(45) Date of Patent: Apr. 11, 2023

(54) GATE DRIVER

(71) Applicant: Infineon Technologies Austria AG, Villach (AT)

(72) Inventors: Mi Ran Baek, Seoul (KR); Junbae Lee, Seoul (KR)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 0 days.

(21) Appl. No.: 17/573,490

(22) Filed: Jan. 11, 2022

(51) Int. Cl.
*H03K 17/082* (2006.01)

(52) U.S. Cl.
CPC ............................ *H03K 17/082* (2013.01)

(58) Field of Classification Search
None
See application file for complete search history.

(56) References Cited

U.S. PATENT DOCUMENTS

| 5,552,747 | A * | 9/1996 | Tomasini | H03K 17/063 |
| | | | | 327/541 |
| 9,362,819 | B1 * | 6/2016 | Gottapu | H02M 3/07 |
| 10,790,818 | B1 | 9/2020 | Frank | |
| 2007/0013361 | A1 * | 1/2007 | Burlak | H03K 17/0822 |
| | | | | 324/142 |
| 2016/0142046 | A1 * | 5/2016 | Powell | H03K 5/249 |
| | | | | 327/306 |
| 2019/0227867 | A1 * | 7/2019 | Ellur | H03M 13/098 |

OTHER PUBLICATIONS

Eric R. Motto, et al., "Speed Shifting Gate Drive for Intelligent Power Modules", Applied Power Electronics Conference and Exposition, 2006, pp. 1684-1690.

* cited by examiner

*Primary Examiner* — Thomas J. Hiltunen
*Assistant Examiner* — Khareem E Almo
(74) *Attorney, Agent, or Firm* — Cooper Legal Group LLC

(57) ABSTRACT

A circuit comprises a gate driver having a supply voltage terminal and configured to generate an output at an output terminal based on an input. A voltage multiplexer is configured to connect a first voltage terminal to the supply voltage terminal responsive to a voltage select signal having a first value and connect a second voltage terminal to the supply voltage terminal responsive to the voltage select signal having a second value. First logic is configured to generate a fault signal responsive to detecting one of a first fault condition associated with operation of the gate driver or a second fault condition associated with operation of the gate driver and generate the voltage select signal having the second value based on the fault signal. Second logic is configured to generate the voltage select signal having the second value after a predetermined delay period based on a value of the input.

20 Claims, 6 Drawing Sheets

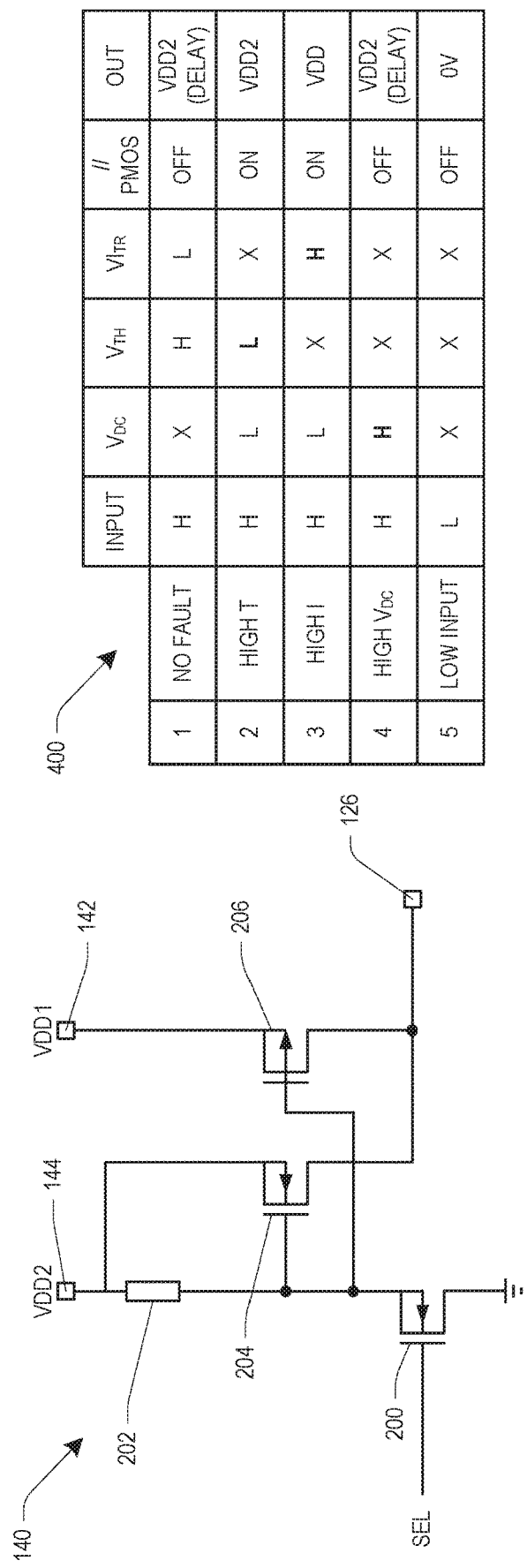
Fig. 4
Fig. 2
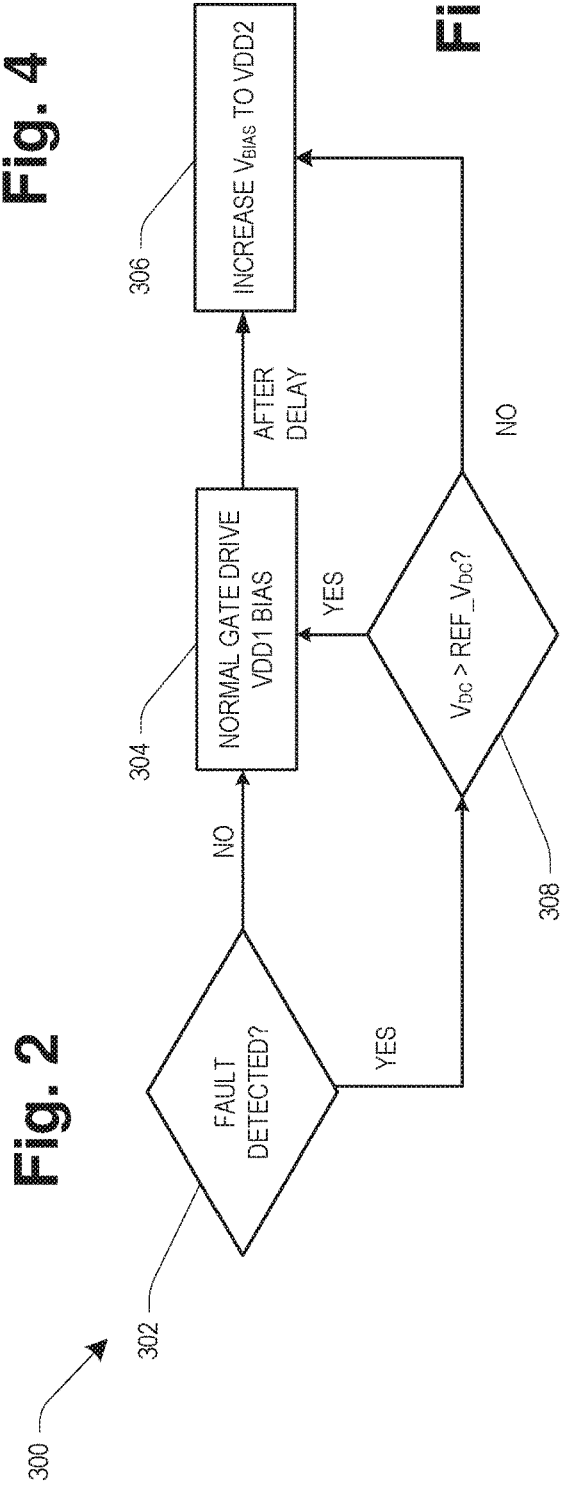
Fig. 3

GATE DRIVER

TECHNICAL FIELD

The present disclosure relates generally to power transistors, and, more particularly, to controlling a gate drive voltage of a power transistor.

BACKGROUND

A power semiconductor device comprises a semiconductor structure configured to conduct a load current along a load current path between two load terminal structures of the device. The load current path may be controlled by a control electrode, sometimes referred to as a gate electrode. Upon receiving a corresponding control signal from the control electrode may set the power semiconductor device in one of a conducting state or a blocking state.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

According to some embodiments, a circuit comprises a gate driver having a supply voltage terminal and configured to generate an output at an output terminal based on an input at an input terminal, a voltage multiplexer configured to connect a first voltage terminal to the supply voltage terminal responsive to a voltage select signal having a first value and connect a second voltage terminal to the supply voltage terminal responsive to the voltage select signal having a second value, first logic configured to generate a fault signal responsive to detecting one of a first fault condition associated with operation of the gate driver or a second fault condition associated with operation of the gate driver and generate the voltage select signal having the second value based on the fault signal, and second logic configured to generate the voltage select signal having the second value after a predetermined delay period based on a value of the input.

According to some embodiments, a circuit comprises a gate driver having a supply voltage terminal and configured to generate an output at an output terminal based on an input at an input terminal, a voltage multiplexer configured to connect a first voltage terminal to the supply voltage terminal responsive to a voltage select signal having a first value and connect a second voltage terminal to the supply voltage terminal responsive to the voltage select signal having a second value, first logic configured to generate a fault signal associated with operation of the gate driver and generate the voltage select signal having the second value based on the fault signal, second logic configured to generate the voltage select signal having the second value after a predetermined delay period based on a value of the input, and a first pull-up transistor coupled between the supply voltage terminal and the output terminal and having a gate terminal coupled to the first logic to receive the fault signal.

According to some embodiments, an apparatus for driving a gate of a transistor comprises means for generating a fault signal based on detecting one of a first fault condition associated with a gate driver for driving the gate of the transistor or a second fault condition associated with the gate driver, means for driving the gate of the transistor using the gate driver at a first voltage responsive to the fault signal having a first value, means for driving the gate of the transistor using the gate driver at a second voltage greater than the first voltage responsive to the fault signal having a second value, and means for driving the gate of the transistor using the gate driver at the second voltage responsive to the fault signal having the first value after a predetermined delay period based on a value of an input to the gate driver.

According to some embodiments, a method for driving a gate of a transistor comprises generating a fault signal based on detecting one of a first fault condition associated with a gate driver for driving the gate of the transistor or a second fault condition associated with the gate driver, driving the gate of the transistor using the gate driver at a first voltage responsive to the fault signal having a first value, driving the gate of the transistor using the gate driver at a second voltage greater than the first voltage responsive to the fault signal having a second value, and driving the gate of the transistor using the gate driver at the second voltage responsive to the fault signal having the first value after a predetermined delay period based on a value of an input to the gate driver.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DESCRIPTION OF THE DRAWINGS

FIG. 2 is a diagram of a voltage multiplexer, according to some embodiments.

FIG. 3 is a logic diagram for driving a gate of a transistor, according to some embodiments.

FIG. 4 is a diagram of a truth table for gate driving control, according to some embodiments.

DETAILED DESCRIPTION

Figure 1:
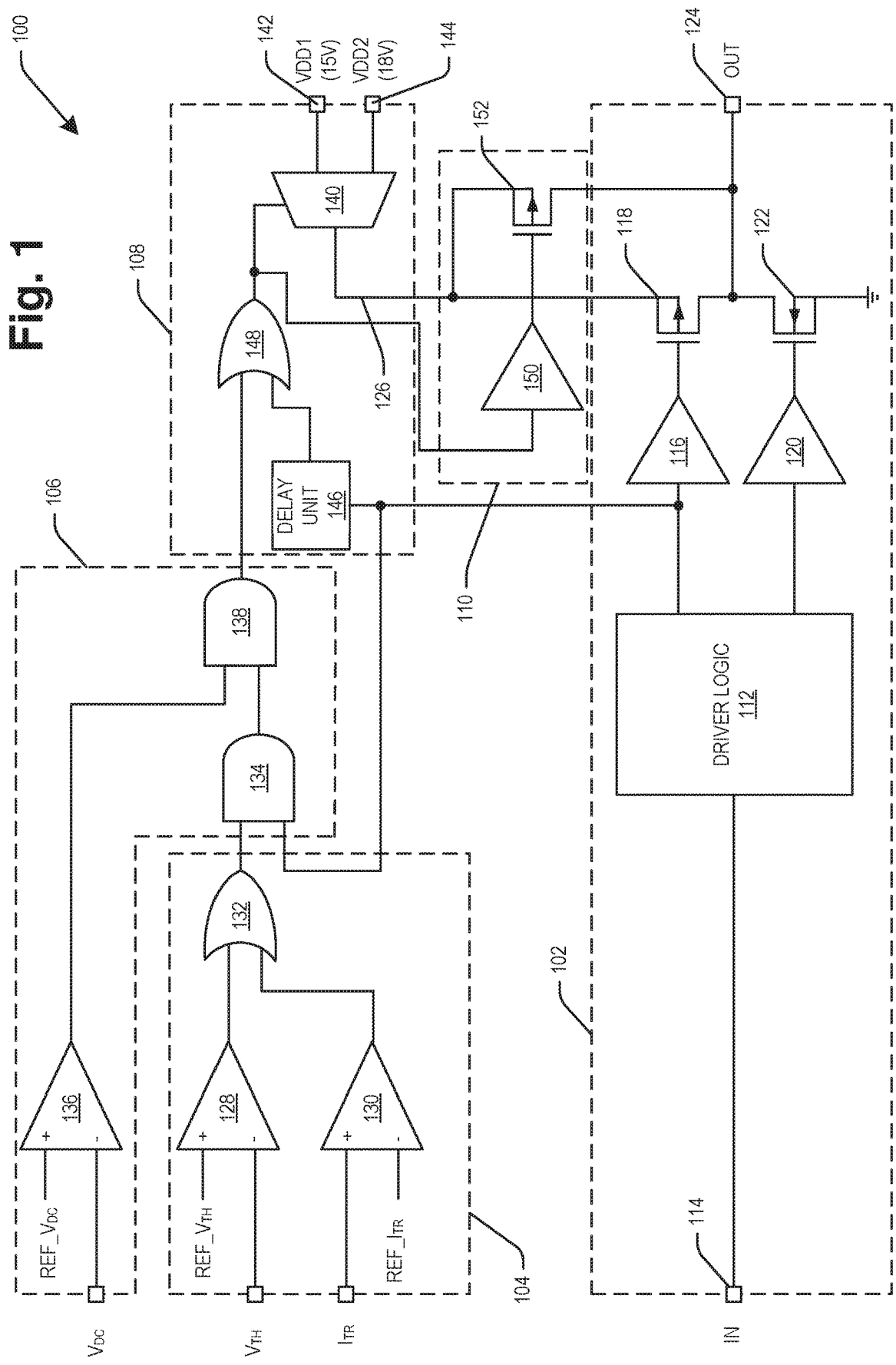
FIG. 1 is a schematic diagram of a gate driver, according to some embodiments.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

Equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope defined by the claims. The following detailed description, therefore, is not to be taken in a limiting sense.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

A gate of a transistor, such as a power transistor is driven in a manner to reduce power loss, thereby improving power density and reducing circuit size and cost. A gate drive capacity of a gate driver is reduced under certain operating conditions, such as high temperature or high current. Under normal operating conditions the gate driver drives the gate of a transistor, such as a power transistor, using a first bias voltage, VDD1. After a predetermined delay, the gate driver increases the bias voltage to a second level, VDD2, higher than VDD1. Increasing the bias voltage decreases the drive current and reduces power consumption. In the case of a first fault condition associated with the gate driver, such as high temperature or high current, the gate driving capacity of the gate driver is reduced and the gate of the transistor is driven at the higher bias voltage, VDD2, without a delay, thereby compensating for the reduced driving capacity. The fault condition being associated with the gate driver includes the fault condition being associated with the device driven by the gate driver.

Referring to FIG. 1 a schematic diagram of a gate driving circuit 100 is provided, according to some embodiments. The gate driving circuit 100 comprises a gate driver 102, fault detection logic 104, fault suppression logic 106, bias voltage selection logic 108, and a resistance reduction circuit 110.

In some embodiments, the gate driver 102 comprises driver logic 112 that receives a gate control signal at an input terminal 114 and generates control signals for a first inverting buffer 116 connected to a pull-up transistor 118 and a second inverting buffer 120 connected to a pull-down transistor 122. The pull-up transistor 118 and the pull-down transistor 122 are connected to an output terminal 124 to generate a gate drive output signal. The gate control signal may be a low voltage signal, such as a signal having a voltage around 5V or less and the gate drive output signal may have a higher voltage, such as around 10-20V. The driver logic 112 may include isolation circuitry, such as transformers to isolate the low voltage input from the high voltage output. Although the input for the driver logic 112 is illustrated as a single level input, a differential input signal may be used.

In some embodiments, the pull-up transistor 118 comprises a p-type transistor and the pull-down transistor 122 comprises an n-type transistor. Responsive to the gate control signal having a high value corresponding to a logic "1" the driver logic 112 activates the inverting buffer 116 to enable the pull-up transistor 118 to connect the output terminal to a supply voltage terminal 126. Responsive to the gate control signal having a low value corresponding to a logic "0" the driver logic 112 activates the inverting buffer 120 to enable the pull-down transistor 118 to connect the output terminal to a reference voltage, such as ground.

In some embodiments, the fault detection logic 104 includes fault detection comparators 128, 130 and an OR gate 132. The first fault detection comparator 128 indicates a first fault condition responsive to a temperature input signal, $V_{TH}$, violating a threshold determined by a temperature reference signal, $REF\_V_{TH}$. In some embodiments, the first fault detection comparator 128 indicates the first fault condition responsive to the temperature input signal, $V_{TH}$, being less than the temperature reference signal, $REF\_V_{TH}$. The second fault detection comparator 130 indicates a second fault condition responsive to a current input signal, $I_{TR}$, violating a threshold determined by a current reference signal, $REF\_I_{TR}$. In some embodiments, the second fault detection comparator indicates the second fault condition responsive to the current input signal, $I_{TR}$, exceeding the current reference signal, $REF\_I_{TR}$. The current reference signal, $I_{TR}$, may comprise a voltage indicative of the current input signal. The OR gate 132 generates a fault signal responsive to a fault condition being detected by any of the fault detection comparators 128, 130. Other structures and configurations of the fault detection logic 104 are within the scope of the present disclosure. For example, different or additional fault conditions may be identified.

In some embodiments, the fault suppression logic 106 suppresses the fault signal generated by the fault detection logic 104 under certain conditions, such as the output signal of the gate driver 102 being a logic "0" or if a DC link voltage, $V_{DC}$, being less than a predetermined value. The fault suppression logic 106 comprises a comparator 136 that indicates a suppression condition responsive to the DC link voltage, $V_{DC}$, violating a threshold determined by a $V_{DC}$ reference signal, $REF\_V_{DC}$. In some embodiments, the comparator 136 indicates the suppression condition responsive to the DC link voltage, $V_{DC}$, being less than the $V_{DC}$ reference signal, $REF\_V_{DC}$. An AND gate 138 suppresses the fault detection signal based on the fault suppression signal from the comparator 136.

The bias voltage selection logic 108 receives the fault signal from the fault detection logic 104 via the fault suppression logic 106 and controls a voltage multiplexer 140 that selects between a first bias voltage, VDD1, at a first voltage terminal 142 and a second bias voltage, VDD2, at a second voltage terminal 144. The bias voltage selected by the voltage multiplexer 140 is provided at the supply voltage terminal 126 for supplying the pull-up transistor 118 to control the output of the gate driver 102. The bias voltage selection logic 108 comprises a delay unit 146 connected to the input of the inverting buffer 116. The input of the inverting buffer 116 indicates the logic level of the output of the gate driver 102. An OR gate 148 receives the output of the fault suppression logic 106 and the output of the delay unit 146. In some embodiments, the delay unit 146 generates a logic "1" after a predetermined time period responsive to the output of the gate driver 102 having a logic "1" level. The predetermined time period may be about 1 microsecond. The OR gate 148 generates a voltage select signal for the voltage multiplexer 140. The voltage multiplexer 140 selects the bias voltage, VDD1, responsive to the fault signal being at a logic "0" state and selects the bias voltage, VDD2, responsive to the fault signal being at a logic "1" state or after the delayed output from the delay unit 146.

In some embodiments, suppressing the fault signal based on $V_{DC}$ reduces electromagnetic interference (EMI). If the bias voltage were set to VDD2 immediately responsive to the fault signal in the presence of a high $V_{DC}$, the EMI could be increased.

In some embodiments, the resistance reduction circuit 110 comprises an inverting buffer 150 that receives the voltage select signal and a pull-up transistor 152 coupled between the supply voltage terminal 126 and the output of the gate driver 102. The inverting buffer 150 enables the pull-up transistor 152 responsive to the voltage select signal having a logic "1" level. The pull-up transistor 152 is connected in parallel with the pull-up transistor 118 of the gate driver 102. In some embodiments, the pull-up transistor 152 and the pull-up transistor 118 are of equal size, and the equivalent resistance at the output of the gate driver 102 is reduced by one half. Reducing the output resistance at the output of the gate driver 102 may allow modification of the circuitry associated with a power transistor being driven by the gate driver 102. For example, the reduced output resistance may allow a gate resistor to be omitted from the power transistor control terminal.

Referring to FIG. 2 a diagram of a voltage multiplexer 140 is provided, according to some embodiments. In some embodiments, the voltage multiplexer 140 comprises a select transistor 200 that receives the voltage select signal, SEL, from the OR gate 148 to select between the bias voltages, VDD1, VDD2. In some embodiments, the select transistor 200 comprises a p-type transistor. A resistor 202 is coupled between the second voltage terminal 144 and a reference voltage, such as ground. A first transistor 204 is coupled between the second voltage terminal 144 and the supply voltage terminal 126. A second transistor 206 is coupled between the first voltage terminal 142 and the supply voltage terminal 126. In some embodiments, the first transistor 204 comprises a p-type transistor and the second transistor 206 comprises an n-type transistor. Responsive to the voltage select signal, SEL, having a logic "0" level, the transistor 206 is enabled coupling the supply voltage terminal 126 to VDD1 at the first voltage terminal 142. Responsive to the voltage select signal, SEL, having a logic "0" level, the transistor 204 is enabled coupling the supply voltage terminal 126 to VDD2 at the second voltage terminal 144. Other structures and configurations of the voltage multiplexer 140 are within the scope of the present disclosure.

Referring to FIG. 3, a logic diagram 300 for driving a gate of a transistor is provided, according to some embodiments. At 302 a fault condition is identified. In some embodiments, the fault condition is a high temperature fault or a high current fault. If a fault condition is not identified at 302, a normal gate drive bias voltage, VDD1, is used at 304. After a predetermined time period, the gate drive bias voltage is increased to VDD2 at 306. If a fault condition is identified at 302, the DC link voltage, $V_{DC}$, is compared to a threshold determined by a $V_{DC}$ reference signal, REF_$V_{DC}$. If the $V_{DC}$ threshold is violated at 308, the normal gate bias VDD1 is applied at 304 followed by the increase to VDD2 at 306 after the predetermined time period. If the $V_{DC}$ threshold is not violated at 308, the increased gate bias VDD2 is applied at 306 without a delay. In some embodiments, suppressing the fault signal based on $V_{DC}$ at 308 can reduce EMI.

Referring to FIG. 4 a diagram of a truth table 400 for gate driving control is provided, according to some embodiments. In the truth table 400 an indicator of "H" indicates a high logic level, an indicator of "L" indicates a low logic level, and an indicator of "X" indicates a don't care condition. If $V_{TH}$ is low and $I_{TR}$ is low, as in row 1, no fault condition is identified and the parallel transistor 152 is off. The bias voltage is set at VDD1 and increases to VDD2 after the predetermined time period. If $V_{TH}$ is high with a high input and low $V_{DC}$, as in row 2, a fault condition is identified. The bias voltage is immediately set to VDD2 and the parallel transistor 152 is on. If $I_{TR}$ is low with a high input and low $V_{DC}$, as in row 3, a fault condition is identified. The bias voltage is immediately set to VDD2 and the parallel transistor 152 is on. If $V_{DC}$ is high, as in row 4, any fault condition is suppressed. The bias voltage is set at VDD1 and increases to VDD2 after the predetermined time period. If the input is low, as in row 5, any fault condition is suppressed. The output is low.

Figure 5:
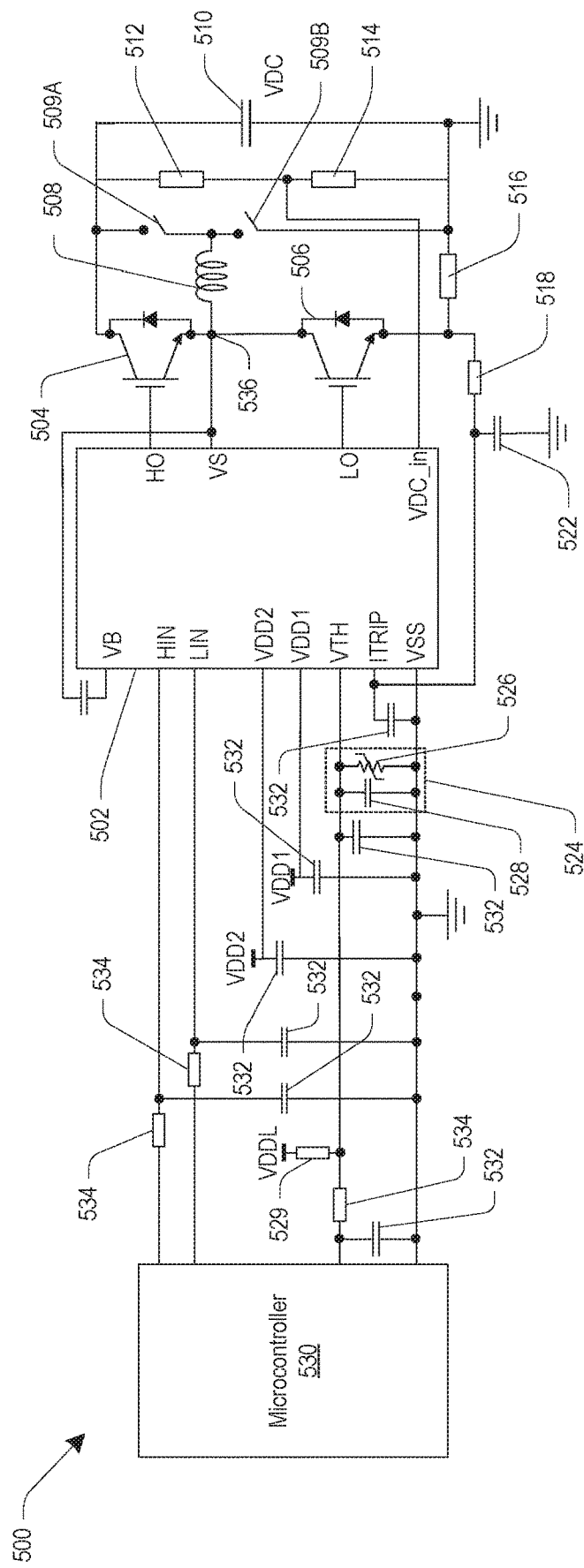
FIG. 5 is a schematic diagram of a system including a two channel gate driver, according to some embodiments.

Referring to FIG. 5 a schematic diagram of a system 500 including a two channel gate driver 502 is provided, according to some embodiments. The two channel gate driver 502 comprises two instances of the gate driving circuit 100 of FIG. 1 to generate a high gate drive signal, HO, for controlling a high side power transistor 504 and a low gate drive signal, LO for controlling a low side power transistor 506. The high side power transistor 504 and the low side power transistor 506 are coupled to a load 508, shown as an inductor. Simplified switches 509A, 509B selectively couple the load 508 to the high side power transistor 504 of ground. The simplified switches 509A, 509B may comprise devices similar to the transistors 504, 506. The simplified switches 509A, 509B may be buffer capacitances to provide a path for the load current. In some embodiments, the load 508 may be associated with an automotive application, a consumer application, and/or industrial application, such as converting electrical energy, driving an electric motor or an electric machine, driving a lighting device, or some other suitable application. A capacitor 510 coupled across the high side power transistor 504 and the low side power transistor 506 stores the DC link voltage, $V_{DC}$. Resistors 512, 514 form a voltage divider to provide an input proportional to the DC link voltage, $V_{DC}$, to the two channel gate driver 502. A shunt resistor 516, a path resistor 518, and a filter capacitor 522 provide a voltage proportional to the load current to provide the current input, $I_{TR}$, to the two channel gate driver 502. A temperature sensor 524 comprising a thyristor 526 and a filter capacitor 528 provide the temperature signal, $V_{TH}$, to the two channel gate driver 502. In some embodiments, the output of the temperature sensor 524 is inversely proportional to the temperature, since the resistance of the thyristor 526 is inversely proportional to temperature. In some embodiments, a resistor 529 connected to a low reference voltage, VDDL, such as a voltage less than around 5V, provides a reference for the temperature sensor 524.

In some embodiments, a microcontroller 530 provides input signals, HIN, LIN to the two channel gate driver 502 for driving the high side power transistor 504 and the low side power transistor 506. In some embodiments, the microcontroller 530 provides a temperature reference signal directly to the two channel gate driver 502 and the temperature sensor 524 is omitted. The two channel gate driver 502 receives the bias voltage VDD1, VDD2. In some embodiments, filter capacitors 532 and/or resistors 534 are provided to stabilize selected inputs to the two channel gate driver 502. The two channel gate driver 502 generates a floating supply voltage VB and a floating supply offset voltage VS to a common node 536 between the high side power transistor 504 and the low side power transistor 506.

Figure 6:
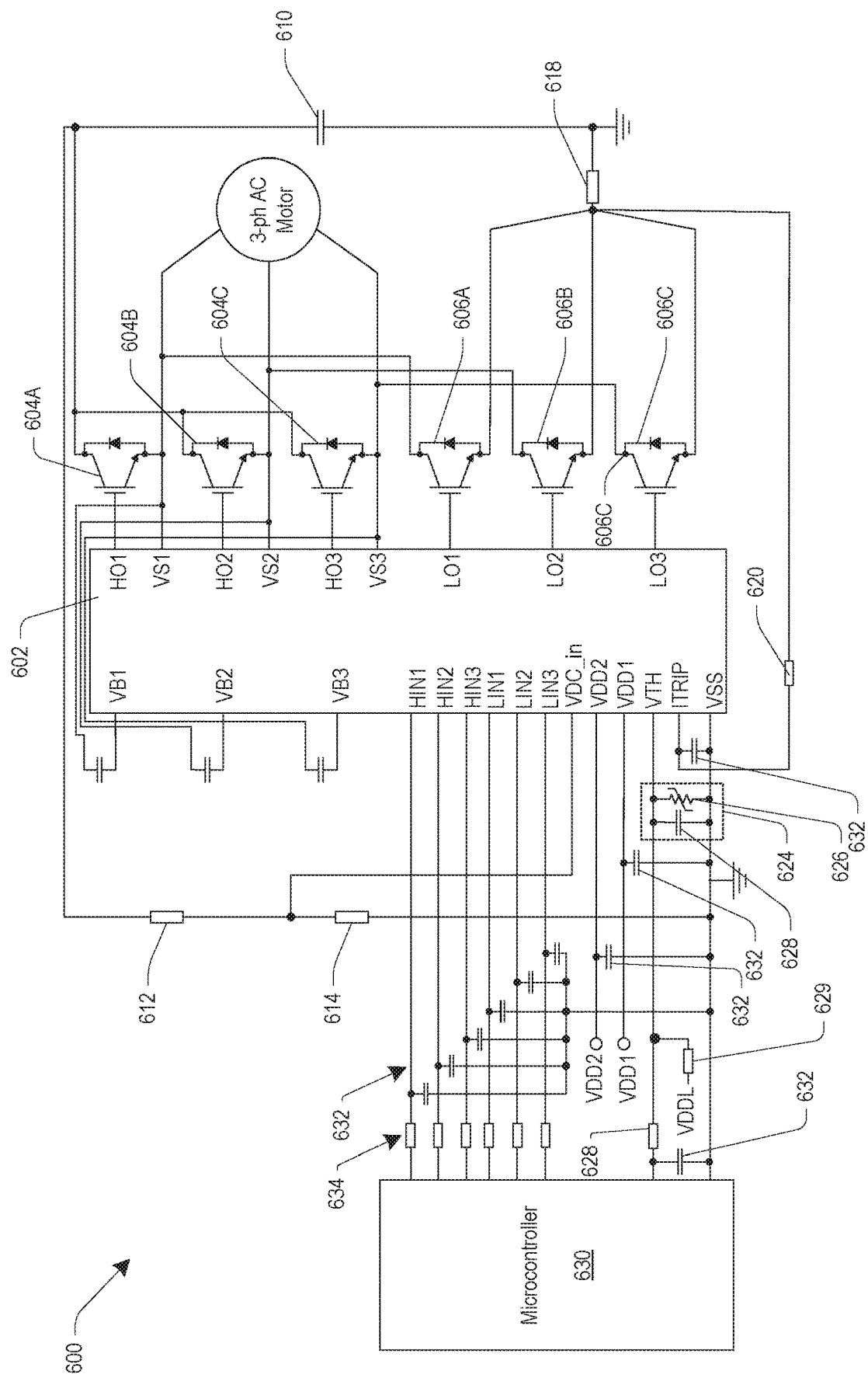
FIG. 6 is a schematic diagram of system including a six channel gate driver, according to some embodiments.

Referring to FIG. 6 a schematic diagram of a system 600 including a six channel gate driver 602 is provided, according to some embodiments. The six channel gate driver 602 comprises six instances of the gate driving circuit 100 of FIG. 1 to generate high gate drive signals, HO1, HO2, HO3, for controlling high side power transistors 604A, 604B, 604C and low gate drive signal, LO1, LO2, LO3 for controlling low side power transistors 606A, 606B, 606C. The high side power transistors 604A, 604B, 604C and the low side power transistors 606A, 606B, 606V are coupled to a load 608, shown as a 3-phase AC motor. A capacitor 610 coupled across the high side power transistors 604A, 604B, 604C and the low side power transistors 606A, 606B, 606V stores the DC link voltage, $V_{DC}$. Resistors 612, 614 form a voltage divider to provide an input proportional to the DC link voltage, $V_{DC}$, to the six channel gate driver 602. A shunt resistor 618 and a path resistor 620 provide a voltage proportional to the load current to provide the current input, $I_{TR}$, to the six channel gate driver 602. A temperature sensor 624 comprising a thyristor 626 and a filter capacitor 628 provide the temperature signal, $V_{TH}$, to the six channel gate driver 602. In some embodiments, the output of the temperature sensor 624 is inversely proportional to the temperature, since the resistance of the thyristor 626 is inversely proportional to temperature. In some embodiments, a resistor 629 connected to a low reference voltage, VDDL, such as a voltage less than around 5V, provides a reference for the temperature sensor 624.

In some embodiments, a microcontroller 630 provides input signals, HIN1-HIN6, LIN1-LIN6 to the six channel gate driver 602 for driving the high side power transistors 604A, 604B, 604C and the low side power transistors 606A, 606B, 606C. In some embodiments, the microcontroller 630 provides a temperature reference signal directly to the six channel gate driver 602 and the temperature sensor 624 is omitted. The six channel gate driver 602 receives the bias voltage VDD1, VDD2. In some embodiments, filter capacitors 632 and/or resistors 634 are provided to stabilize selected inputs to the six channel gate driver 602. The six channel gate driver 602 generates floating supply voltages VB1-VB3 and floating supply offset voltages VS1-VS3 to common nodes 636A-636B between the high side power transistors 604A, 604B, 604C and the low side power transistors 606A, 606B, 606V.

Furthermore, some of the disclosed techniques may be readily implemented in software using object or object-oriented software development environments that provide portable source code that can be used on a variety of computer or workstation platforms. Alternatively, the disclosed techniques and/or arrangements may be implemented partially or fully in hardware using standard logic circuits or VLSI design.

Moreover, the disclosed procedures may be readily implemented in software that can be stored on a computer-readable storage medium (such as a memory storage device), executed on programmed general-purpose computer with the cooperation of a controller and memory, a special purpose computer, a microprocessor, or the like. In these instances, the arrangements and procedures of the described implementations may be implemented as program embedded on personal computer such as an applet, JAVA® or CGI script, as a resource residing on a server or computer workstation, as a routine embedded in a dedicated communication arrangement or arrangement component, or the like. The arrangements may also be implemented by physically incorporating the arrangements and/or procedures into a software and/or hardware system, such as the hardware and software systems of a test/modeling device.

Figure 7:
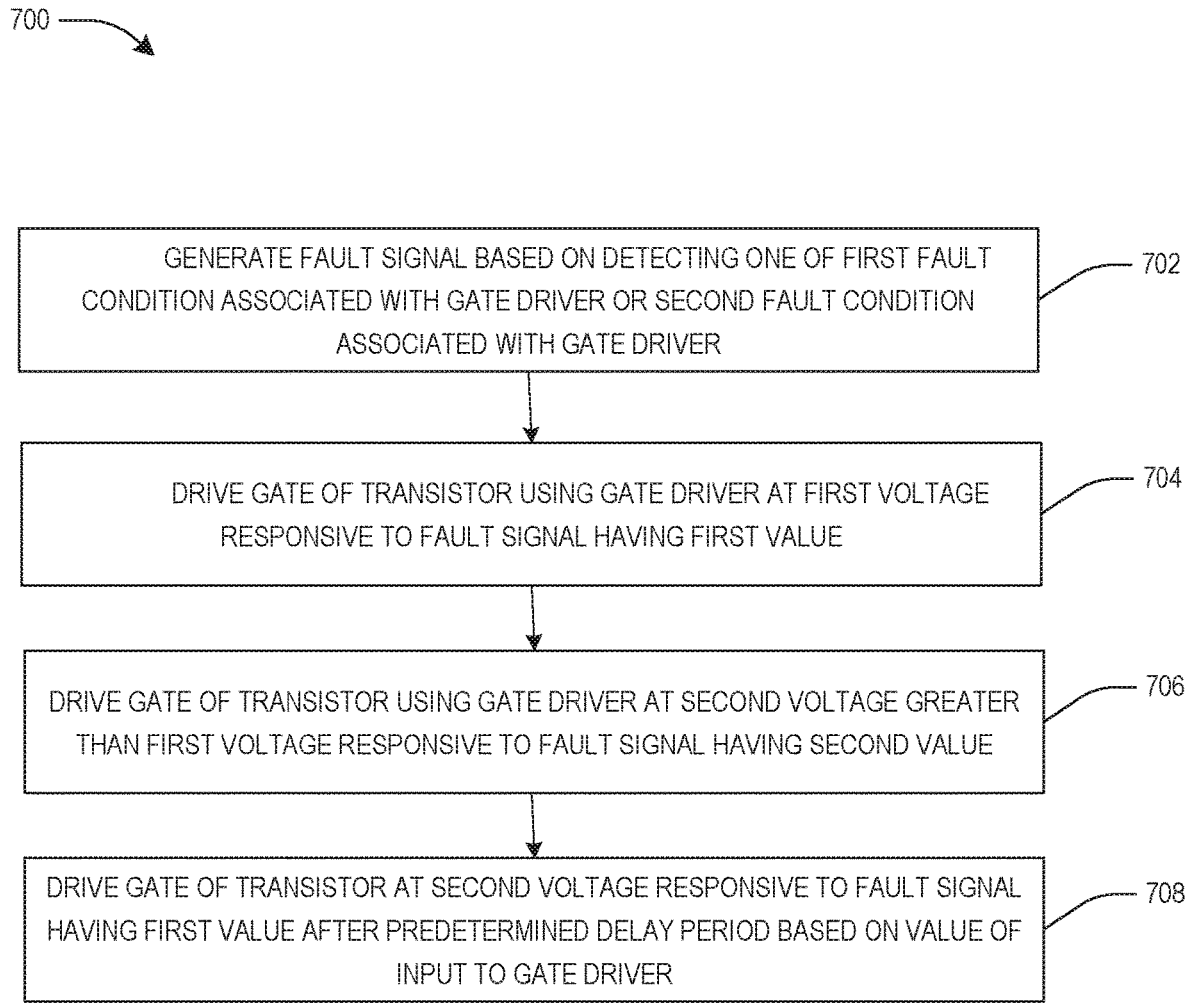
FIG. 7 illustrates a method of driving a transistor gate, according to some embodiments.

Referring to FIG. 7, a flow diagram of a method 700 for driving a transistor gate is provided, according to some embodiments. At 702 a fault signal is generated based on detecting one of a first fault condition associated with a gate driver 102 for driving the gate of the transistor or a second fault condition associated with the gate driver 102. The first fault condition or the second fault condition being associated with the gate driver includes the fault condition being associated with the device driven by the gate driver. At 704 the gate of the transistor is driven using the gate driver at a first voltage responsive to the fault signal having a first value. At 706, the gate of the transistor is driven using the gate driver 102 at a second voltage greater than the first voltage responsive to the fault signal having a second value. At 708, the gate of the transistor is driven using the gate driver 102 at the second voltage responsive to the fault signal having the first value after a predetermined delay period based on a value of an input to the gate driver 102.

Figure 8:
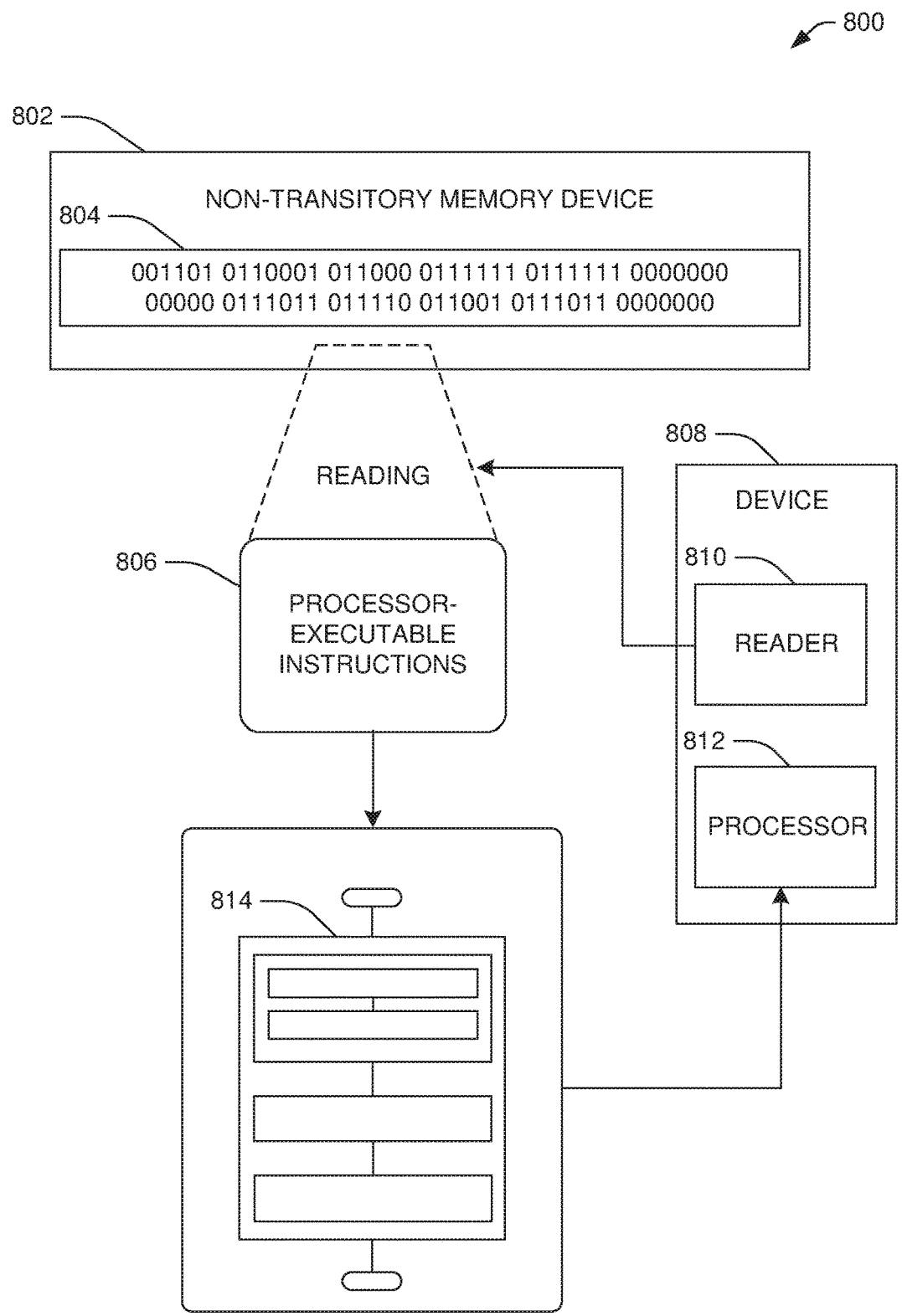
FIG. 8 illustrates an exemplary computer-readable medium, according to some embodiments.

FIG. 8 illustrates an exemplary embodiment 800 of a computer-readable medium 802, according to some embodiments. One or more embodiments involve a computer-readable medium comprising processor-executable instructions configured to implement one or more of the techniques presented herein. The embodiment 800 comprises a non-transitory computer-readable medium 802 (e.g., a CD-R, DVD-R, flash drive, a platter of a hard disk drive, etc.), on which is encoded computer-readable data 804. This computer-readable data 804 in turn comprises a set of processor-executable computer instructions 806 that, when executed by a computing device 808 including a reader 810 for reading the processor-executable computer instructions 806 and a processor 812 for executing the processor-executable computer instructions 806, are configured to facilitate operations according to one or more of the principles set forth herein. In some embodiments, the processor-executable computer instructions 806, when executed, are configured to facilitate performance of a method 814, such as at least some of the aforementioned method(s). In some embodiments, the processor-executable computer instructions 806, when executed, are configured to facilitate implementation of a system, such as at least some of the one or more aforementioned system(s). Many such computer-readable media may be devised by those of ordinary skill in the art that are configured to operate in accordance with the techniques presented herein.

The term "computer readable media" may include communication media. Communication media typically embodies computer readable instructions or other data in a "modulated data signal" such as a carrier wafer or other transport mechanism and includes any information delivery media. The term "modulated data signal" may include a signal that has one or more of its characteristics set or changed in such a manner as to encode information in the signal.

According to some embodiments, a circuit comprises a gate driver having a supply voltage terminal and configured to generate an output at an output terminal based on an input at an input terminal, a voltage multiplexer configured to connect a first voltage terminal to the supply voltage terminal responsive to a voltage select signal having a first value and connect a second voltage terminal to the supply voltage terminal responsive to the voltage select signal having a second value, first logic configured to generate a fault signal responsive to detecting one of a first fault condition associated with operation of the gate driver or a second fault condition associated with operation of the gate driver and generate the voltage select signal having the second value based on the fault signal, and second logic configured to generate the voltage select signal having the second value after a predetermined delay period based on a value of the input.

According to some embodiments, the circuit comprises third logic configured to suppress the fault signal responsive to a load voltage exceeding a first threshold.

According to some embodiments, the circuit comprises third logic configured to suppress the fault signal responsive to the input having a value corresponding to a logic zero.

According to some embodiments, the circuit comprises a temperature terminal configured to receive a temperature signal, wherein the first logic is configured to detect the first fault condition responsive to the temperature signal violating a threshold.

According to some embodiments, the circuit comprises a temperature sensor coupled to the temperature terminal.

According to some embodiments, the circuit comprises a current feedback terminal configured to receive a current signal, wherein the first logic is configured to detect the second fault condition responsive to the current signal violating a threshold.

According to some embodiments, the circuit comprises a first pull-up transistor coupled between the supply voltage terminal and the output terminal and having a gate terminal coupled to the first logic to receive the fault signal.

According to some embodiments, the gate driver comprises control logic coupled to the input terminal and configured to generate an enable signal based on the input, and a second pull-up transistor coupled between the supply voltage terminal and the output terminal and having a gate terminal coupled to the control logic to receive the enable signal, the first pull-up transistor comprises a p-type transistor, and the second pull-up transistor comprises a p-type transistor.

According to some embodiments, a circuit comprises a gate driver having a supply voltage terminal and configured to generate an output at an output terminal based on an input at an input terminal, a voltage multiplexer configured to connect a first voltage terminal to the supply voltage terminal responsive to a voltage select signal having a first value and connect a second voltage terminal to the supply voltage terminal responsive to the voltage select signal having a second value, first logic configured to generate a fault signal associated with operation of the gate driver and generate the voltage select signal having the second value based on the fault signal, second logic configured to generate the voltage select signal having the second value after a predetermined delay period based on a value of the input, and a first pull-up transistor coupled between the supply voltage terminal and the output terminal and having a gate terminal coupled to the first logic to receive the fault signal.

According to some embodiments, the first logic is configured to generate the fault signal responsive to at least one of a temperature signal at a first terminal coupled to the first logic violating a first threshold or a current signal at a second terminal coupled to the first logic violating a second threshold.

According to some embodiments, the circuit comprises a temperature sensor coupled to the first terminal.

According to some embodiments, the circuit comprises an inverter having an input terminal connected to the first logic for receiving the fault signal and an output terminal connected to the gate terminal, wherein the first pull-up transistor comprises a p-type transistor.

According to some embodiments, the gate driver comprises control logic coupled to the input terminal and configured to generate an enable signal based on the input and a second pull-up transistor coupled between the supply voltage terminal and the output terminal and having a gate terminal coupled to the control logic to receive the enable signal, the first pull-up transistor comprises a p-type transistor, and the second pull-up transistor comprises a p-type transistor.

According to some embodiments, the circuit comprises third logic coupled to the input terminal and configured to suppress the fault signal responsive to the input having a value corresponding to a logic zero.

According to some embodiments, an apparatus for driving a gate of a transistor comprises means for generating a fault signal based on detecting one of a first fault condition associated with a gate driver for driving the gate of the transistor or a second fault condition associated with the gate driver, means for driving the gate of the transistor using the gate driver at a first voltage responsive to the fault signal having a first value, means for driving the gate of the transistor using the gate driver at a second voltage greater than the first voltage responsive to the fault signal having a second value, and means for driving the gate of the transistor using the gate driver at the second voltage responsive to the fault signal having the first value after a predetermined delay period based on a value of an input to the gate driver.

According to some embodiments, a method for driving a gate of a transistor comprises generating a fault signal based on detecting one of a first fault condition associated with a gate driver for driving the gate of the transistor or a second fault condition associated with the gate driver, driving the gate of the transistor using the gate driver at a first voltage responsive to the fault signal having a first value, driving the gate of the transistor using the gate driver at a second voltage greater than the first voltage responsive to the fault signal having a second value, and driving the gate of the transistor using the gate driver at the second voltage responsive to the fault signal having the first value after a predetermined delay period based on a value of an input to the gate driver.

According to some embodiments, the method comprises suppressing the fault signal responsive to a load voltage exceeding a threshold.

According to some embodiments, the method comprises suppressing the fault signal responsive to the input to the gate driver having a value corresponding to a logic zero.

According to some embodiments, generating the fault signal comprises detecting the first fault condition responsive to a temperature signal violating a first threshold and detecting the second fault condition responsive to a current signal violating a second threshold.

According to some embodiments, the method comprises enabling a first pull-up transistor connected to the second voltage responsive to the fault signal having the second value, wherein the first pull-up transistor is connected in parallel with the gate driver.

According to some embodiments, enabling the first pull-up transistor comprises inverting the fault signal to generate an inverted fault signal and controlling a gate of the first pull-up transistor using the inverted fault signal.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A circuit, comprising:
   a gate driver having a supply voltage terminal and configured to generate an output at an output terminal based on an input at an input terminal;
   a voltage multiplexer configured to connect a first voltage terminal to the supply voltage terminal responsive to a voltage select signal having a first value and connect a second voltage terminal to the supply voltage terminal responsive to the voltage select signal having a second value;
   first logic configured to generate a fault signal responsive to detecting one of a first fault condition associated with operation of the gate driver or a second fault condition associated with operation of the gate driver and generate the voltage select signal having the second value based on the fault signal; and
   second logic configured to generate the voltage select signal having the second value after a predetermined delay period based on a value of the input, wherein:
   responsive to the input having a value corresponding to a logic one, a voltage at the output terminal matches a voltage at the first voltage terminal responsive to the voltage select signal having the first value and the voltage at the output terminal matches a voltage at the second voltage terminal responsive to the voltage select signal having the second value.

2. The circuit of claim 1, comprising:
   third logic configured to suppress the fault signal responsive to a load voltage exceeding a first threshold.

3. The circuit of claim 1, comprising:
   third logic configured to suppress the fault signal responsive to the input having a value corresponding to a logic zero.

4. The circuit of claim 1, comprising:
   a temperature terminal configured to receive a temperature signal, wherein:
   the first logic is configured to detect the first fault condition responsive to the temperature signal violating a threshold.

5. The circuit of claim 4, comprising:
   a temperature sensor coupled to the temperature terminal.

6. The circuit of claim 5, comprising:
   a current feedback terminal configured to receive a current signal, wherein:
   the first logic is configured to detect the second fault condition responsive to the current signal violating a threshold.

7. The circuit of claim 1, comprising:
   a first pull-up transistor coupled between the supply voltage terminal and the output terminal and having a gate terminal coupled to the first logic to receive the fault signal.

8. The circuit of claim 7, wherein:
   the gate driver comprises:
   control logic coupled to the input terminal and configured to generate an enable signal based on the input; and
   a second pull-up transistor coupled between the supply voltage terminal and the output terminal and having a gate terminal coupled to the control logic to receive the enable signal,
   the first pull-up transistor comprises a p-type transistor; and
   the second pull-up transistor comprises a p-type transistor.

9. A circuit, comprising:
a gate driver having a supply voltage terminal and configured to generate an output at an output terminal based on an input at an input terminal;
a voltage multiplexer configured to connect a first voltage terminal to the supply voltage terminal responsive to a voltage select signal having a first value and connect a second voltage terminal to the supply voltage terminal responsive to the voltage select signal having a second value;
first logic configured to generate a fault signal associated with operation of the gate driver and generate the voltage select signal having the second value based on the fault signal;
second logic configured to generate the voltage select signal having the second value after a predetermined delay period based on a value of the input; and
a first pull-up transistor coupled between the supply voltage terminal and the output terminal and having a gate terminal coupled to the first logic to receive the fault signal, wherein:
responsive to the input having a value corresponding to a logic one, a voltage at the output terminal matches a voltage at the first voltage terminal responsive to the voltage select signal having the first value and the voltage at the output terminal matches a voltage at the second voltage terminal responsive to the voltage select signal having the second value.

10. The circuit of claim 9, wherein:
the first logic is configured to generate the fault signal responsive to at least one of a temperature signal at a first terminal coupled to the first logic violating a first threshold or a current signal at a second terminal coupled to the first logic violating a second threshold.

11. The circuit of claim 10, comprising:
a temperature sensor coupled to the first terminal.

12. The circuit of claim 9, comprising:
an inverter having an input terminal connected to the first logic for receiving the fault signal and an output terminal connected to the gate terminal, wherein:
the first pull-up transistor comprises a p-type transistor.

13. The circuit of claim 12, wherein:
the gate driver comprises:
control logic coupled to the input terminal and configured to generate an enable signal based on the input; and
a second pull-up transistor coupled between the supply voltage terminal and the output terminal and having a gate terminal coupled to the control logic to receive the enable signal,
the first pull-up transistor comprises a p-type transistor, and
the second pull-up transistor comprises a p-type transistor.

14. The circuit of claim 9, comprising:
third logic coupled to the input terminal and configured to suppress the fault signal responsive to the input having a value corresponding to a logic zero.

15. A method for driving a gate of a transistor, comprising:
generating a fault signal based on detecting one of a first fault condition associated with a gate driver for driving the gate of the transistor or a second fault condition associated with the gate driver;
driving the gate of the transistor using the gate driver at a first voltage responsive to the fault signal having a first value;
driving the gate of the transistor using the gate driver at a second voltage greater than the first voltage responsive to the fault signal having a second value; and
driving the gate of the transistor using the gate driver at the second voltage responsive to the fault signal having the first value after a predetermined delay period based on a value of an input to the gate driver, wherein:
responsive to the input having a value corresponding to a logic one, a voltage at the gate of the transistor matches the first voltage responsive to the fault signal having the first value and the voltage at the gate of the transistor matches the second voltage responsive to the fault signal having the second value.

16. The method of claim 15, comprising:
suppressing the fault signal responsive to a load voltage exceeding a threshold.

17. The method of claim 15, comprising:
suppressing the fault signal responsive to the input to the gate driver having a value corresponding to a logic zero.

18. The method of claim 15, wherein generating the fault signal comprises:
detecting the first fault condition responsive to a temperature signal violating a first threshold; and
detecting the second fault condition responsive to a current signal violating a second threshold.

19. The method of claim 15, comprising:
enabling a first pull-up transistor connected to the second voltage responsive to the fault signal having the second value, wherein
the first pull-up transistor is connected in parallel with the gate driver.

20. The method of claim 19, wherein enabling the first pull-up transistor comprises:
inverting the fault signal to generate an inverted fault signal; and
controlling a gate of the first pull-up transistor using the inverted fault signal.

* * * * *